(12) United States Patent
Dennison

(10) Patent No.: US 7,274,049 B2
(45) Date of Patent: *Sep. 25, 2007

(54) SEMICONDUCTOR ASSEMBLIES

(75) Inventor: Charles H. Dennison, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 282 days.

This patent is subject to a terminal disclaimer.

(21) Appl. No.: 11/116,472

(22) Filed: Apr. 27, 2005

(65) Prior Publication Data

US 2005/0194659 A1 Sep. 8, 2005

Related U.S. Application Data

(60) Continuation of application No. 10/630,114, filed on Jul. 29, 2003, now Pat. No. 6,897,542, which is a division of application No. 09/932,040, filed on Aug. 16, 2001, now Pat. No. 6,833,291.

(51) Int. Cl.
*H01L 29/00* (2006.01)

(52) U.S. Cl. .................... 257/209; 257/530

(58) Field of Classification Search ............. 257/209, 257/530
See application file for complete search history.

(56) References Cited

U.S. PATENT DOCUMENTS

| | | | |
|---|---|---|---|
| 5,110,764 A | 5/1992 | Lowrey et al. | |
| 5,171,715 A | 12/1992 | Husher et al. | |
| 5,191,241 A | 3/1993 | McCollum et al. | |
| 5,233,217 A | 8/1993 | Dixit et al. | |
| 5,674,787 A | 10/1997 | Zhao et al. | |
| 5,742,555 A | 4/1998 | Marr et al. | |
| 5,780,323 A | 7/1998 | Forouhi et al. | |
| 5,830,797 A | 11/1998 | Cleeves | |
| 6,081,021 A * | 6/2000 | Gambino et al. | 257/530 |
| 6,087,677 A | 7/2000 | Wu | |
| 6,124,194 A | 9/2000 | Shao et al. | |
| 6,154,398 A | 11/2000 | Cutter et al. | |
| 6,335,228 B1 | 1/2002 | Fuller et al. | |
| 6,458,631 B1 | 10/2002 | Brintzinger et al. | |

* cited by examiner

*Primary Examiner*—Lex Malsawma
(74) *Attorney, Agent, or Firm*—Wells St. John P.S.

(57) ABSTRACT

The invention includes a semiconductor processing method wherein an insulative mass is formed across a first electrical node and a second electrical node. The mass has a pair of openings extending therethrough to the electrical nodes. The individual openings each have a periphery defined by one of the electrical nodes and at least one sidewall. One of the openings extends to the first electrical node and is a first opening, and the other of the openings extends to the second electrical node and is a second opening. A dielectric material layer is formed within the openings to narrow the openings. Conductive material plugs are formed within the narrowed openings. The conductive material plug within the first opening is a first material plug, and is separated from the first electrical node by the dielectric material; and the conductive plug within the second opening is a second material plug, and is not separated from the second electrical node by the dielectric material. The invention also includes a semiconductor assembly comprising an anti-fuse construction and an electrically conductive interconnect construction.

18 Claims, 6 Drawing Sheets

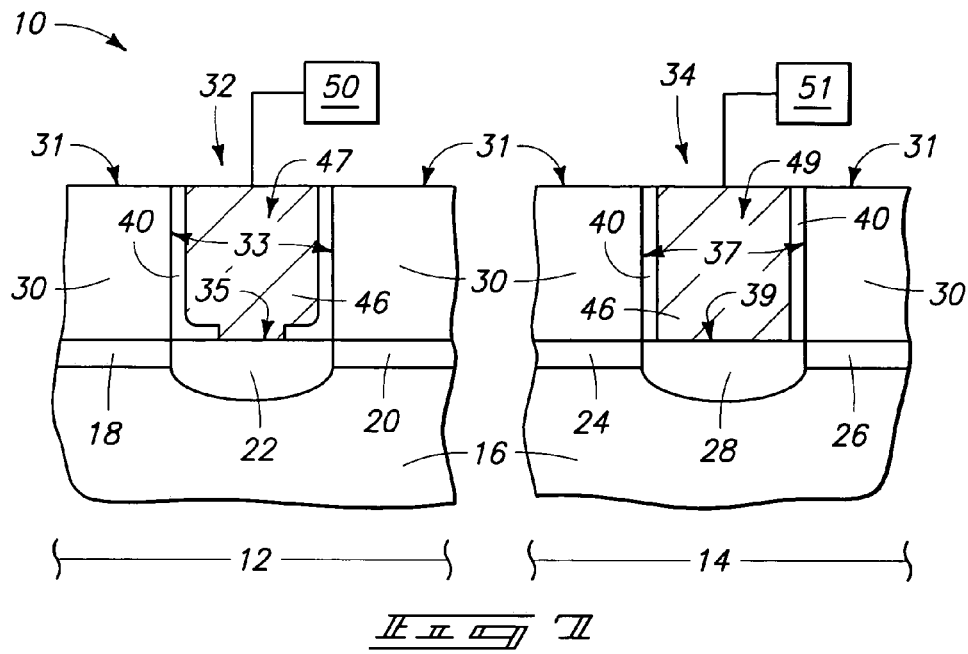
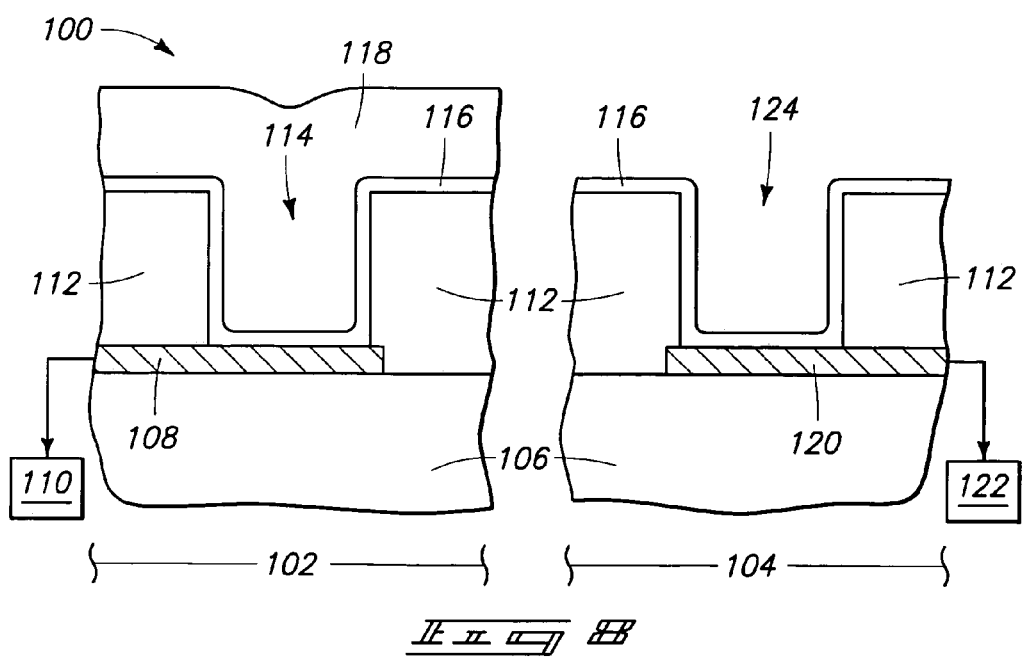

SEMICONDUCTOR ASSEMBLIES

RELATED PATENT DATA

This patent resulted from a continuation application of U.S. patent application Ser. No. 10/630,114, which was filed Jul. 29, 2003, and which is now U.S. Pat. No. 6,897,542; and which is a divisional application of U.S. patent application Ser. No. 09/932,040, now U.S. Pat. No. 6,833,291, which was filed Aug. 16, 2001.

TECHNICAL FIELD

The invention pertains to semiconductor processing methods which can be utilized for forming semiconductor constructions. In particular applications, the invention encompasses methods of forming anti-fuse constructions while forming conductive interconnects. The invention also pertains to semiconductor assemblies.

BACKGROUND OF THE INVENTION

It is a continuing goal of semiconductor processing to reduce the number of fabrication steps utilized in forming semiconductor devices. One method by which the number of fabrication steps can be reduced is to utilize common fabrication steps in forming two or more separate devices. The present invention encompasses new methods of utilizing common processing steps to simultaneously form portions of two or more different semiconductor structures.

SUMMARY OF THE INVENTION

In one aspect, the invention encompasses a semiconductor processing method wherein an insulative mass is formed across a first electrical node and a second electrical node. The mass has a pair of openings extending therethrough to the electrical nodes. The individual openings each have a periphery defined by one of the electrical nodes and at least one sidewall. One of the openings extends to the first electrical node and is a first opening, and the other of the openings extends to the second electrical node and is a second opening. A dielectric material layer is formed within the openings to narrow the openings. Conductive material plugs are formed within the narrowed openings. The conductive material plug within the first opening is a first material plug, and is separated from the first electrical node by the dielectric material; and the conductive plug within the second opening is a second material plug, and is not separated from the second electrical node by the dielectric material.

In another aspect, the invention encompasses a semiconductor assembly comprising an anti-fuse construction and an electrically conductive interconnect construction.

BRIEF DESCRIPTION OF THE DRAWINGS

Preferred embodiments of the invention are described below with reference to the following accompanying drawings.

FIG. 7 is a view of the FIG. 1 fragments shown at a processing step subsequent to that of FIG. 6.

FIG. 8 is a view of a pair of fragments of a semiconductor construction shown at a preliminary processing step of a second method of the present invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
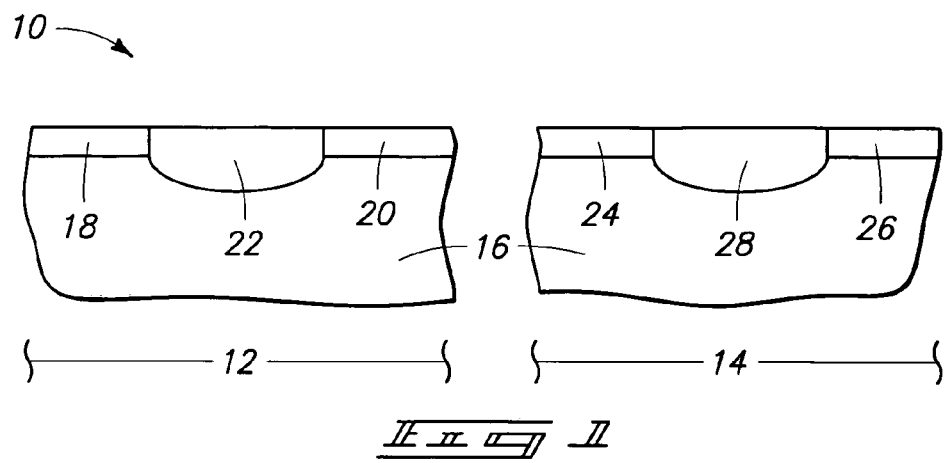
FIG. 1 is a diagrammatic, cross-sectional view of a pair of fragments of a semiconductor construction at a preliminary processing step of a method of the present invention.

An exemplary method of the present invention is described with reference to FIGS. 1-7. Referring initially to FIG. 1, fragments of a semiconductor structure 10 are illustrated. Specifically, structure 10 is divided into a first fragmentary portion 12 and a second fragmentary portion 14. One of portions 12 and 14 can correspond to an n-well portion of a semiconductor structure and the other of portions 12 and 14 can correspond to a p-well portion of the semiconductor structure in particular embodiments of the present invention.

Portion 12 comprises a substrate 16. Substrate 16 can be, for example, monocrystalline silicon lightly-doped with a background p-type dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Spaced isolation regions 18 and 20 are formed within substrate 16. Isolation regions 18 and 20 can comprise, for example, silicon dioxide formed in accordance with shallow trench isolation methodologies. A conductively-doped diffusion region 22 is formed between spaced isolation regions 18 and 20. Conductively-doped region 22 can comprise either n-type dopant or p-type dopant.

Referring next to fragment 14, such comprises the substrate 16, and comprises spaced isolation regions 24 and 26 formed within substrate 16. Isolation regions 24 and 26 can comprise, for example, silicon dioxide. A conductively-doped diffusion region 28 is formed between spaced isolation regions 24 and 26. Diffusion region 28 can comprise either n-type or p-type dopant.

Regions 22 and 28 of fragments 12 and 14 can be considered to be electrical nodes, and in particular aspects of the invention can be considered to be a first electrical node and a second electrical node, respectively.

Figure 2:
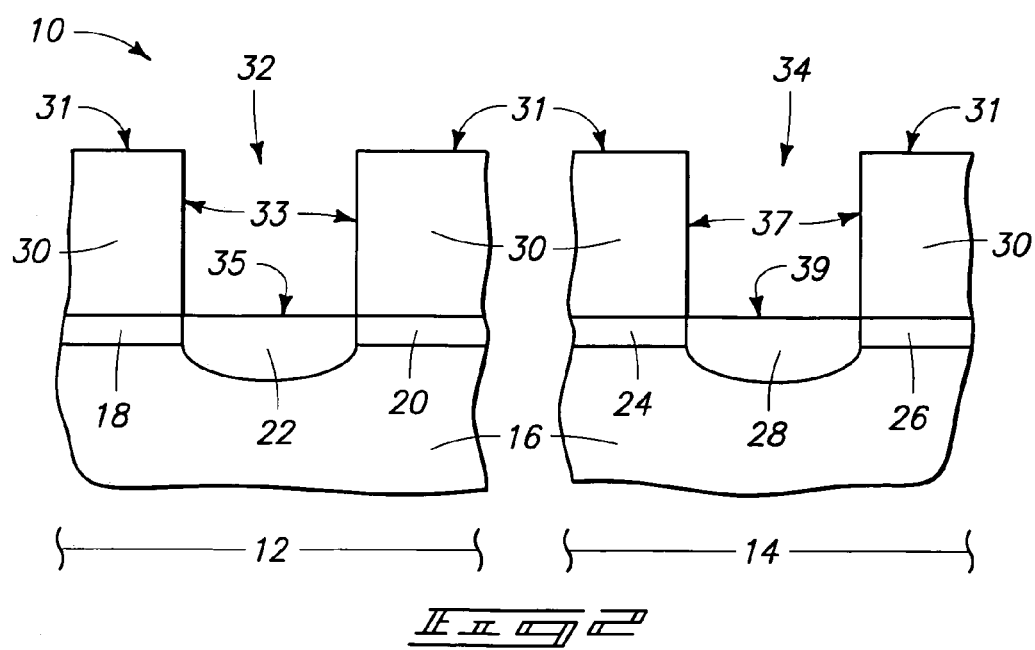
FIG. 2 is a view of the FIG. 1 fragments shown at a processing step subsequent to that of FIG. 1.

Referring to FIG. 2, an insulative mass 30 is formed over fragments 12 and 14. Mass 30 can comprise, for example, borophosphosilicate glass (BPSG). Mass 30 comprises an upper surface 31.

A pair of openings 32 and 34 are formed through insulative mass 30. Openings 32 and 34 can be considered to be first and second openings, respectively. Opening 32 comprises a periphery defined by sidewalls 33 and at least a portion of an exposed surface 35 of electrical node 22. Opening 34 comprises a periphery defined by sidewalls 37 and an exposed surface 39 of electrical node 28. Openings 32 and 34 can have any of various geometries when viewed from a top-down orientation (such a view is not shown), including, for example, a circular geometry.

It is noted that although diffusion regions 22 and 28 are shown formed prior to formation of openings 32 and 34, such diffusion regions can also be formed after forming openings 32 and 34.

Figure 3:
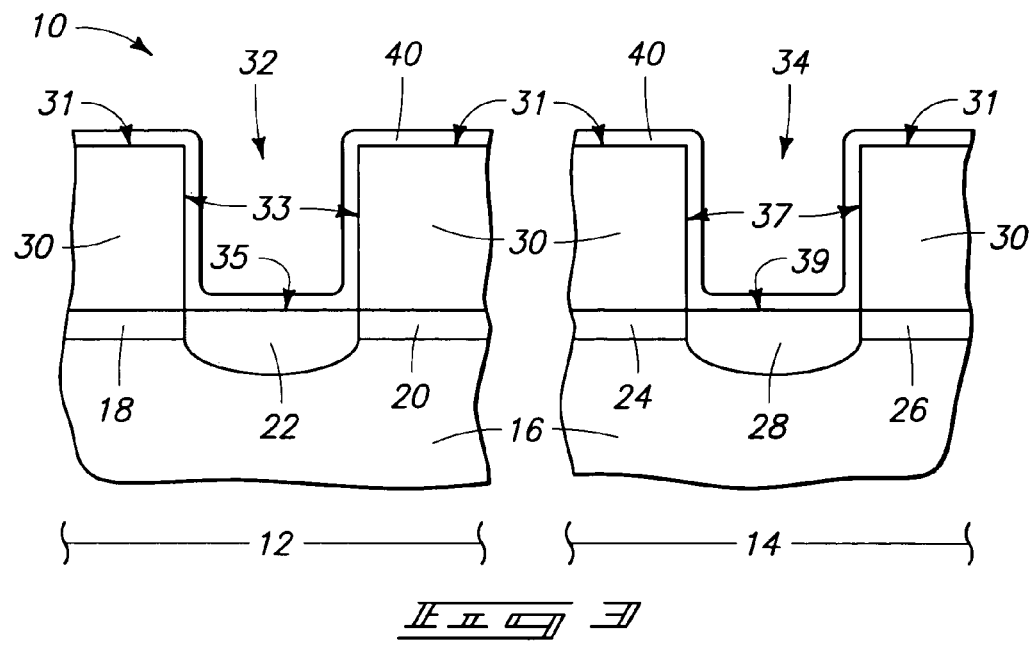
FIG. 3 is a view of the FIG. 1 fragments shown at a processing step subsequent to that of FIG. 2.

Referring to FIG. 3, a dielectric layer 40 is formed within openings 32 and 34. Layer 40 only partially fills openings 32 and 34, and accordingly narrows openings 32 and 34. The dielectric material of layer 40 is preferably formed simultaneously within both of openings 32 and 34, and can be formed by, for example, chemical vapor deposition. In exemplary constructions, the dielectric material of layer 40 can comprise, consist essentially of, or consist of silicon nitride ($Si_3N_4$) or silicon oxynitride ($Si_xO_yN_z$, wherein x, y and z are greater than 0), and can be formed to a thickness of, for example, from about 30 Å to about 100 Å.

Figure 4:
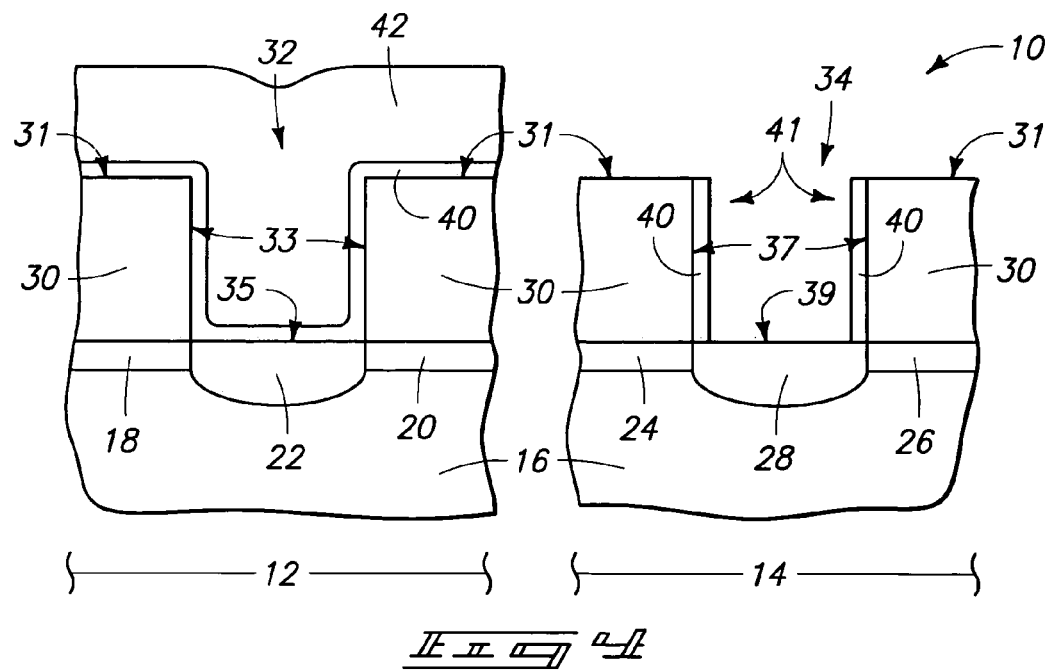
FIG. 4 is a view of the FIG. 1 fragments shown at a processing step subsequent to that of FIG. 3.

Referring to FIG. 4, a protective mask 42 is formed over portion 12, while leaving portion 14 uncovered by such protective mask. Protective mask 42 can comprise, for example, photoresist, and can be patterned to selectively mask portion 12 and not portion 14, by, for example, photolithographic processing. Unprotected portion 14 is exposed to an anisotropic etch which removes dielectric material 40 from over upper surface 31 of insulative material 30, and from over a predominant portion of the bottom periphery 39 of opening 34. The anisotropic etching of dielectric material 40 leaves a portion of material 40 along sidewalls 37 of opening 34 to define a spacer 41 around a lateral periphery of opening 34.

Figure 5:
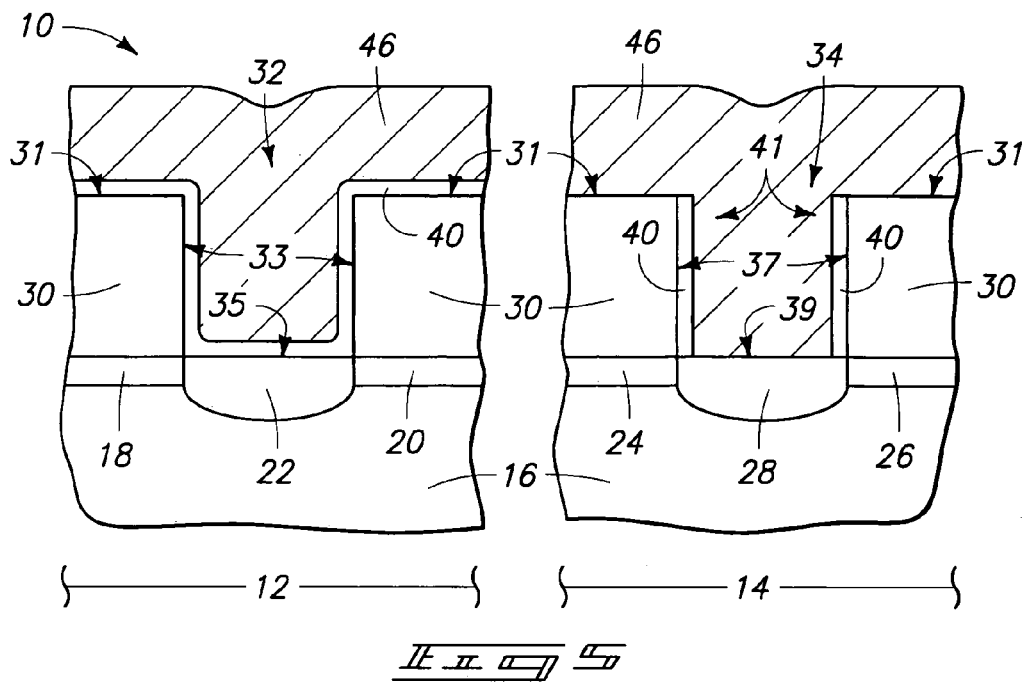
FIG. 5 is a view of the FIG. 1 fragments shown at a processing step subsequent to that of FIG. 4.

Referring to FIG. 5, a conductive mass 46 is formed within the narrowed openings 32 and 34. Conductive mass 46 can comprise conductively-doped silicon (such as, for example, n-type or p-type doped polycrystalline silicon); and/or it can comprise one or more metals. If conductive material 46 comprises a metal, it can comprise, for example, one or more of tungsten, copper, or aluminum. Although conductive mass 46 is shown as a single homogeneous mass, it is to be understood that the mass can comprise multiple layers of conductive materials. For instance, conductive mass 46 can comprise a layer of titanium nitride, or a composite film of Ti followed by TiN, lying across dielectric material 40 and partially filling openings 32 and 34, and a remaining portion comprising tungsten. Mass 46 is preferably formed simultaneously over fragments 12 and 14, and can be formed by, for example, sputter deposition, physical vapor deposition (PVD), and/or chemical vapor deposition (CVD) of appropriate materials; and/or chemical vapor deposition of silicon which is simultaneously or subsequently doped with one or more conductivity-enhancing dopants.

Figure 6:
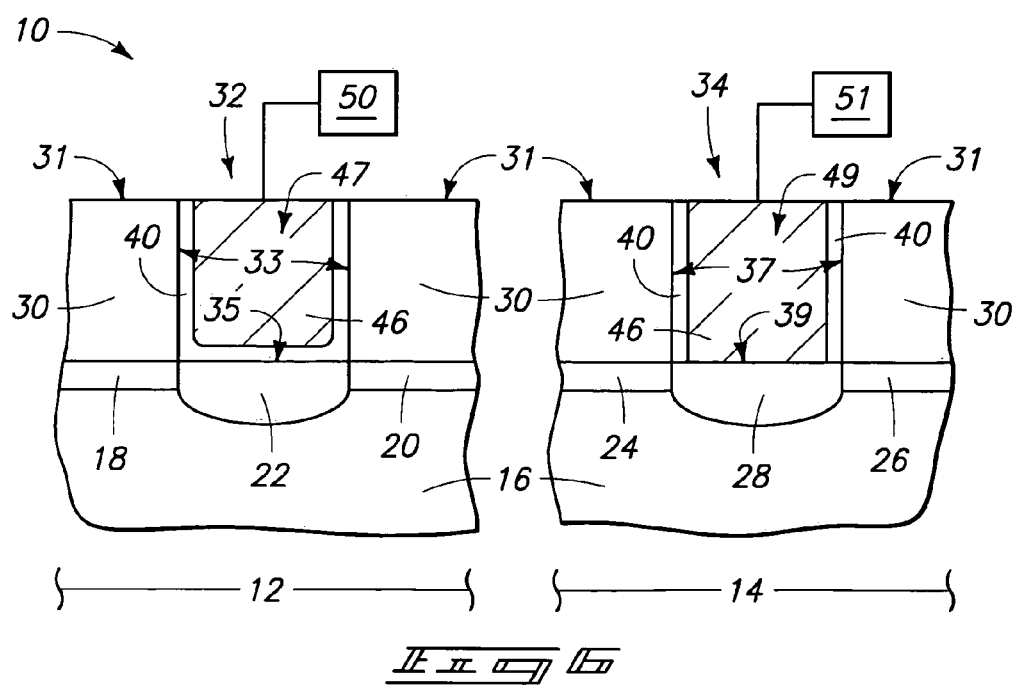
FIG. 6 is a view of the FIG. 1 fragments shown at a processing step subsequent to that of FIG. 5.

Referring to FIG. 6, fragments 12 and 14 are subjected to planarization to remove mass 46 from over upper surface 31 of insulative mass 30. Suitable planarization can comprise, for example, chemical-mechanical polishing. In the shown embodiment, the planarization has also removed dielectric material 40 from over upper surface 31 relative to portion 12. The conductive mass 46 remaining within opening 32 defines a first conductive material plug 47, and the conductive mass 46 remaining within second opening 34 defines a second conductive material plug 49. First conductive material plug 47 is separated from first electrical node 22 by dielectric material 40, whereas second conductive material plug 49 is not separated from second electrical node 28 by dielectric material 40. Accordingly, the first conductive material plug 47 is not in electrical contact with the first electrical node 22, but the second conductive material plug 49 is in electrical contact with the second electrical node 28. In the shown embodiment, second conductive material plug 49 is shown formed against an upper surface 39 of second electrical node 28.

First conductive plug 47 is connected to a first electrical source 50, and second electrical plug 49 is connected to a second electrical power source 51. Second plug 49 defines an electrical interconnect between second electrical node 28 and second electrical source 51; whereas first conductive plug 47, together with dielectric material 40 defines an anti-fuse between first electrical node 22 and first electrical source 50.

Referring to FIG. 7, fragment 12 is illustrated after sufficient power has been provided to first conductive plug 47 to rupture the dielectric material 40 and form an electrical connection between conductive plug 47 and first electrical node 22. In other words, sufficient power is provided to first conductive plug 47 to effectively "blow" the dielectric material of the anti-fuse and form an electrical interconnect between plug 47 and electrical node 22.

The embodiment described with reference to FIGS. 1-7 advantageously forms an anti-fuse structure (the structure comprising conductive plug 47 of FIG. 6) and a conductive interconnect (the structure comprising conductive plug 49 of FIG. 6) using common processing steps to form a dielectric material (40) within the anti-fuse and along sidewall surfaces of the conductive interconnect; and also utilizing common processing steps to form the first conductive plug utilized in the anti-fuse and the second conductive plug utilized in the conductive interconnect. In embodiments in which the dielectric material 40 is formed across fragments 12 and 14 by a simultaneous and common process, the dielectric material will have the same chemical constituency across both fragments. Also, in embodiments in which the conductive material of plugs 47 and 49 is formed across fragments 12 and 14 by a simultaneous and common process, the plugs will have the same chemical constituency as one another.

The dielectric material 40 can have an advantageous use as a barrier layer in the conductive interconnect structure of FIG. 6. Specifically, if dielectric material 40 comprises silicon nitride, such can alleviate or prevent diffusion of dopants from BPSG mass 30 to the conductive material of plug 46 and vice versa. The consequences of such unwanted cross-diffusion (e.g., p-type diffusion out of a p+ polysilicon plug and n-type dopant diffusion from the surrounding borophosphosilicate glass, BPSG, into the p+ polysilicon plug) can include significantly higher resistance which can severely degrade circuit performance. It is noted that silicon nitride has been utilized for such purpose in the past, however, the silicon nitride utilized for such purpose was not provided simultaneously with silicon nitride utilized in an anti-fuse during past processing methodology.

A second embodiment of the present invention is described with reference to FIGS. 8-11. Referring initially to FIG. 8, a semiconductor construction 100 is illustrated comprising fragments 102 and 104. Fragment 102 comprises a substrate 106 having a conductive material 108 formed thereover. Substrate 106 can comprise, for example, a semiconductive material wafer lightly-doped with background p-type dopant, or can comprise other semiconductor constructions. Conductive material 108 can comprise, for example, conductively-doped polysilicon and/or metal. In particular embodiments, conductive material 108 can comprise copper, titanium, tungsten and/or aluminum. Conductive material 108 is connected to other circuitry which is diagrammatically illustrated as 110. An insulative mass 112 is formed over conductive material 108 and an opening 114 extends through insulative mass 112 to an upper surface of conductive material 108. A dielectric material 116 is formed within opening 114 to partially fill, and accordingly narrow, opening 114. Subsequently, a protective mask 118 is formed over dielectric material 116. Insulative material 112 dielectric material 116 and protective mask 118 can comprise, for example, the same materials described previously for insulative mass 30, dielectric material 40 and protective mask 42, respectively.

Referring to fragment 104, such comprises substrate 106. A conductive material 120 is formed over substrate 106, and such can comprise either conductively doped silicon or metal, and can, for example, comprise the same materials described previously for conductive material 108. Conductive material 120 is connected to other circuitry 122 as illustrated diagrammatically in FIG. 8. Insulative mass 112 extends over conductive material 120, and an opening 124 is formed through insulative mass 112 to an upper surface of conductive material 120. Subsequently, dielectric material 116 is formed within opening 124 to narrow the opening. Insulative mass 112 and dielectric material 116 can be formed over fragments 102 and 104 in common processing steps; and further conductive materials 108 and 120 can be formed in common processing steps. Conductive materials 108 and 120 can be considered first and second electrical nodes, respectively.

Figure 9:
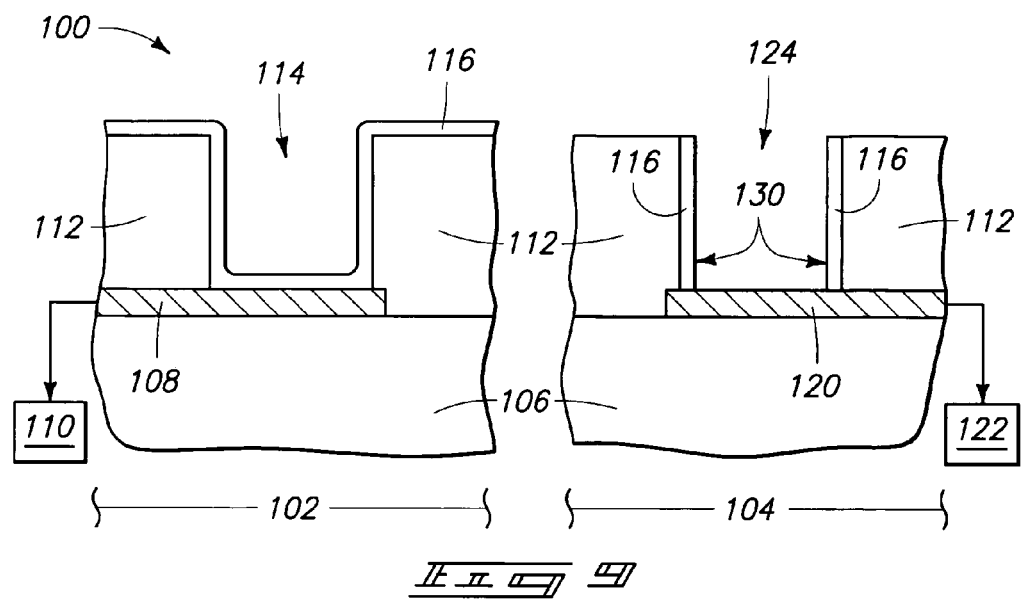
FIG. 9 is a view of the FIG. 8 fragments shown at a processing step subsequent to that of FIG. 8.

Referring to FIG. 9, dielectric material 116 is anisotropically etched to remove the material from over an upper surface of insulative mass 112, as well as from over an upper surface of conductive material 120. The etched material 116 over portion 104 defines one or more spacers 130 around a lateral periphery of opening 124. After the anisotropic etch of dielectric material 116 over fragment 104, protective mass 118 (FIG. 8) is removed to leave the shown structure of portion 102 illustrated in FIG. 9.

Figure 10:
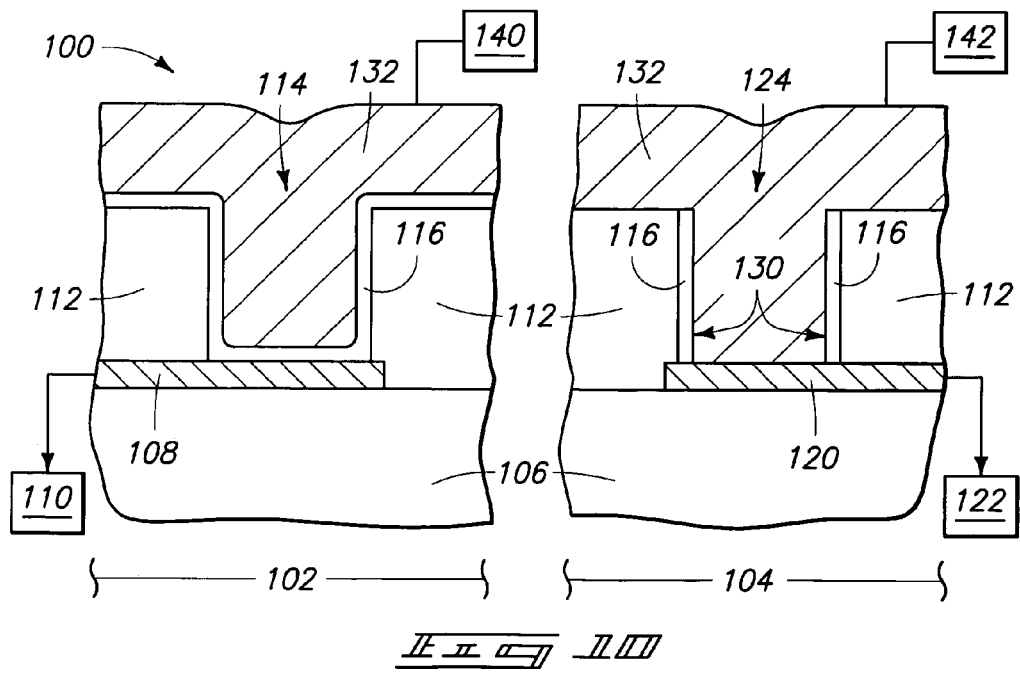
FIG. 10 is a view of the FIG. 8 fragments shown at a processing step subsequent to that of FIG. 9.

Referring to FIG. 10, a conductive material 132 is formed within openings 114 and 124. Conductive material 132 can comprise, for example, conductively doped silicon and/or metal. Conductive material 132 can, for example, comprise the same materials described above with reference to conductive material 46. Conductive material 132 of portion 102 can be connected with a first power source 140, and conductive material 132 of portion 104 can be connected with a second power source 142. In particular embodiments, power sources 140 and 142 can be the same as one another. Conductive material 132 within first opening 114, together with the dielectric material 116 within first opening 114 defines an anti-fuse between power source 140 and circuitry 110. (It is to be understood that even though 140 is described as a power source and 110 is described as circuitry, the invention encompasses embodiments wherein 110 is the power source and 140 is the circuitry.) In contrast, material 132 of portion 140 defines an electrical connection between power source 142 and circuitry 122. (It is to be understood that the invention encompasses embodiments wherein power source 142 and circuitry 122 are reversed, such that 142 corresponds to circuitry and 122 corresponds to a power source.)

Figure 11:
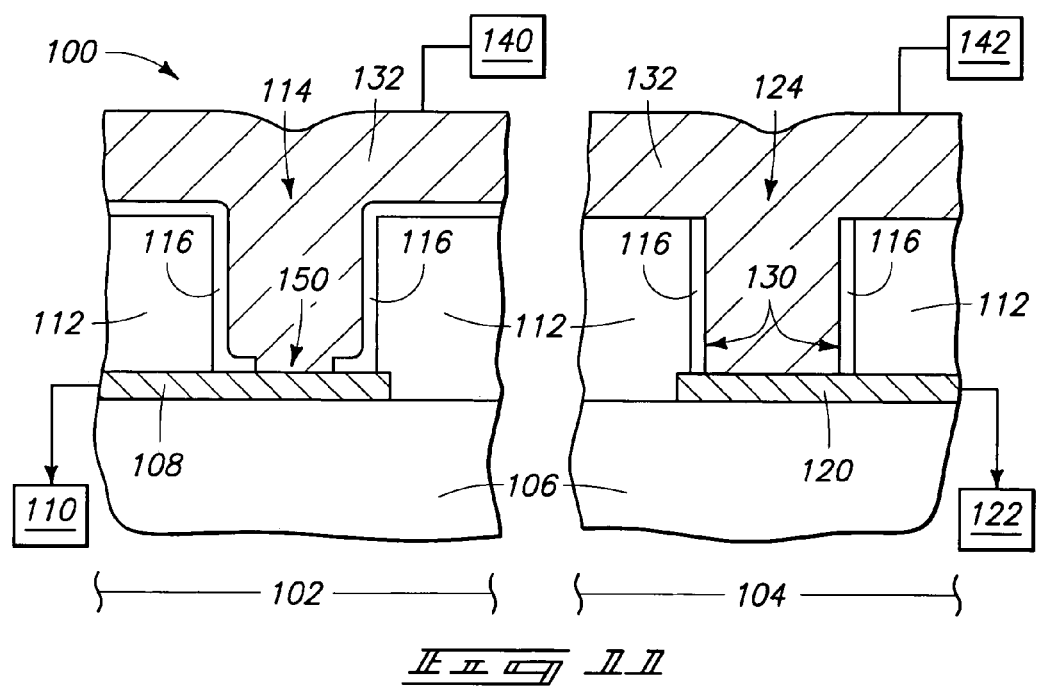
FIG. 11 is a view of the FIG. 8 fragments shown at a processing step subsequent to that of FIG. 10.

Referring to FIG. 11, construction 100 is illustrated after sufficient power has been provided relative to the anti-fuse structure of portion 102 to form an electrical connection 150 extending through dielectric material 116. Such electrical connection electrically connects conductive material 132 of portion 102 with first electrical node 108.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A semiconductor assembly, comprising:
   a semiconductor substrate having first and second conductively-doped diffusion regions extending therein;
   an insulative material over the substrate; the insulative material having a first opening extending therethrough to the first diffusion region and having a second opening extending therethrough to the second diffusion region;
   a dielectric material providing liners within the first and second openings and having lateral peripheries substantially coextensive with lateral peripheries of the first and second diffusion regions; the first liner extending entirely across the first diffusion region at a bottom of the first opening; the second liner not extending across a predominant portion of the second diffusion region at a bottom of the second opening;
   conductive material plugs within the first and second openings; the conductive material plug within the first opening being spaced from the first diffusion region by the first liner; the conductive material plug within the second opening being in direct physical contact with the second diffusion region; and
   the first diffusion region, dielectric material within the first opening, and conductive material plug within the first opening together being incorporated into an anti-fuse construction.

2. The semiconductor assembly of claim 1 wherein:
   the insulative material has a planar uppermost surface;
   the first and second liners have planar uppermost surfaces coplanar with the planar uppermost surface of the insulative material; and
   the conductive plugs within the first and second openings have planar uppermost surfaces coplanar with the planar uppermost surface of the insulative material.

3. The semiconductor assembly of claim 1 wherein the dielectric material comprises silicon nitride.

4. The semiconductor assembly of claim 3 wherein the dielectric material has a thickness of from about 30 Å to about 100 Å.

5. The semiconductor assembly of claim 1 wherein the first diffusion region is a p-type doped diffusion region.

6. The semiconductor assembly of claim 1 wherein the first diffusion region is an n-type doped diffusion region.

7. The semiconductor assembly of claim 1 wherein the conductive plugs comprise conductively-doped silicon.

8. The semiconductor assembly of claim 1 wherein the conductive plugs comprise at least one metal.

9. The semiconductor assembly of claim 8 wherein the at least one metal includes tungsten.

10. The semiconductor assembly of claim 8 wherein the at least one metal includes copper.

11. The semiconductor assembly of claim 8 wherein the at least one metal includes aluminum.

12. A semiconductor assembly, comprising:

a semiconductor substrate having first and second electrical nodes supported thereby;

a layer over the substrate; the layer having a first opening extending therethrough to the first node and having a second opening extending therethrough to the second node;

first and second dielectric material liners within the first and second openings, respectively;

conductive material plugs within the first and second openings; the conductive material plug within the first opening being separated from the first node by the first liner, and the conductive material plug within the second opening extending through the second liner to directly physically contact the second node;

the second dielectric material liner having a planar uppermost surface coplanar with a planar uppermost surface of the layer; and the first node, dielectric material within the first opening, and conductive material plug within the first opening together being incorporated into an anti-fuse construction.

13. The semiconductor assembly of claim 12 wherein:

the first and second nodes are first and second conductively-doped diffusion regions extending into a semiconductive material of the semiconductor substrate; and the first liner extends across an entirety of the first diffusion region.

14. The semiconductor assembly of claim 12 wherein the dielectric material comprises silicon nitride.

15. The semiconductor assembly of claim 14 wherein the dielectric material has a thickness of from about 30 Å to about 100 Å.

16. The semiconductor assembly of claim 12 wherein the conductive plugs comprise conductively-doped silicon.

17. The semiconductor assembly of claim 12 wherein the conductive plugs comprise at least one metal.

18. The semiconductor assembly of claim 12 wherein the first and second electrical nodes are metallic.

* * * * *